(12) United States Patent  (10) Patent No.: US 9,418,982 B2
Deng et al.  (45) Date of Patent: Aug. 16, 2016

(54) MULTI-LAYERED INTEGRATED CIRCUIT WITH SELECTIVE TEMPERATURE COEFFICIENT OF RESISTANCE

(71) Applicant: International Business Machines Corporation, Armonk, NY (US)

(72) Inventors: Yanqing Deng, North Potomac, MD (US); Sungjae Lee, Schenectady, NY (US); Edward J. Nowak, Essex Junction, VT (US); Jin Z. Wallner, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/578,678

(22) Filed: Dec. 22, 2014

(65) Prior Publication Data

US 2016/0181239 A1  Jun. 23, 2016

(51) Int. Cl.
*H01L 27/02* (2006.01)
*H01L 27/08* (2006.01)
*H01L 49/02* (2006.01)
*H01L 21/768* (2006.01)

(52) U.S. Cl.
CPC ........ *H01L 27/0288* (2013.01); *H01L 21/7684* (2013.01); *H01L 21/7685* (2013.01); *H01L 21/76877* (2013.01); *H01L 27/0802* (2013.01); *H01L 28/20* (2013.01)

(58) Field of Classification Search
CPC ............ H01L 27/0288; H01L 21/7684; H01L 21/7685; H01L 21/76877; H01L 27/0802; H01L 28/20; H01L 2027/11842; H01L 29/7408
See application file for complete search history.

(56) References Cited

U.S. PATENT DOCUMENTS 4,104,607 A  8/1978 Jones
5,352,923 A  10/1994 Boyd et al.
(Continued)

OTHER PUBLICATIONS

W. Steinhögl et al., "Comprehensive study of the resistivity of copper wires with lateral dimensions of 100 nm and smaller," Journal of Applied Physics, vol. 97, No. 2, 2005, 023706, 7 pages.

(Continued)

*Primary Examiner* — Julio J Maldonado
*Assistant Examiner* — Farun Lu
(74) *Attorney, Agent, or Firm* — Steven J. Meyers; Hoffman Warnick LLC

(57) ABSTRACT

The integrated circuit described herein includes: a first resistor having a first trench in a dielectric layer, the first trench having a first width; a second resistor having a second trench in the dielectric layer, the second trench having a second width not equal to the first width; a trench in a dielectric layer, a first conductive layer having a first TCR and coating at least a portion of the first trench and the second trench; and a second conductive layer having a second TCR and coating at least a portion of the first conductive layer in each of the first trench and the second trench, wherein the second TCR is not equal to the first TCR, and wherein the TCR of the IC is selected based on a dimension of the trench, a thickness of the first conductive layer, and a thickness of the second conductive layer.

20 Claims, 17 Drawing Sheets

(56) References Cited

U.S. PATENT DOCUMENTS

| | | | |
|---|---|---|---|
| 5,554,873 A | 9/1996 | Erdeljac et al. | |
| 6,815,319 B2 * | 11/2004 | Leidy | H01L 22/34 438/543 |
| 6,891,747 B2 | 5/2005 | Bez et al. | |
| 7,217,981 B2 | 5/2007 | Coolbaugh et al. | |
| 7,714,694 B2 | 5/2010 | Landsberger et al. | |
| 8,110,862 B2 | 2/2012 | Cheng et al. | |
| 8,436,426 B2 | 5/2013 | Le Neel et al. | |
| 2005/0156281 A1 * | 7/2005 | Eshun | H01C 7/06 257/536 |

OTHER PUBLICATIONS

Q. X. Jia., et al., "Stable thin film resistors using double layer structure," Journal of Materials Research, vol. 10, No. 06, 1995, pp. 1523-1528.

* cited by examiner

# MULTI-LAYERED INTEGRATED CIRCUIT WITH SELECTIVE TEMPERATURE COEFFICIENT OF RESISTANCE

BACKGROUND

The present invention relates to integrated circuits. More particularly, the invention relates to multiple-layer integrated circuits having a selective temperature coefficient of resistance.

The operation of integrated circuits (ICs) may be influenced by its operating temperature, and therefore, operating temperature ranges must be taken into account during the design and fabrication of integrated circuits. For example, one element of an integrated circuit that is affected by temperature is a resistor. A change in operating temperature often affects a change in current. The temperature dependence of a resistor adversely effects performance of the IC in certain ranges of operating temperature.

Temperature coefficient of resistance (TCR) refers to the change in resistance per change in temperature degree. Some materials have a positive TCR, meaning resistance increases as operating temperature increases, and some materials have a negative TCR, meaning resistance decreases as operating temperature increases. A material having a zero TCR does not exhibit changes in resistance due to changes in operating temperature.

The ability to select a given TCR by design of the integrated circuit may be desirable, but previously this has only been possible with integrated circuit processes that provide multiple types of resistors of varying TCR materials. Generally, the TCR of a thin-film resistor is controlled by the individual TCR of each constituent film, and there is a lack of additional tunability wherever the film compositions are fixed. Additionally, these currently used thin-filmed resistors are bulky and not generally compatible with very-large scale integration (VLSI) semiconductor technology.

SUMMARY

A first aspect of the invention includes an integrated circuit (IC) with a selective temperature coefficient of resistance (TCR). The IC comprises: a first resistor having a first trench in a dielectric layer, the first trench having a first width; a second resistor having a second trench in the dielectric layer, the second trench having a second width not equal to the first width; a first conductive layer coating at least a portion of the first trench and the second trench, the first conductive layer having a first TCR; and a second conductive layer coating at least a portion of the first conductive layer in each of the first trench and the second trench, the second conductive layer having a second TCR, wherein the second TCR is not equal to the first TCR, and wherein the TCR of the IC is selected based on a dimension of the trench, a thickness of the first conductive layer, and a thickness of the second conductive layer.

A second aspect of the invention includes an IC. The IC comprises: a first set of a plurality of trenches formed in a dielectric layer, and a first set of multi-layered structures, each multi-layered structure of the first set of the multi-layered structures in a respective trench of the first set of a plurality of trenches and including: a first conductive layer coating at least a portion of the respective trench in the first set of a plurality of trenches, the first conductive layer having a first TCR, and a second conductive layer coating at least a portion of the first conductive layer, the second conductive layer having a second TCR, wherein the second TCR is not equal to the first TCR, and wherein the TCR of the IC is selected based on dimensions of each of the trenches in the first set of a plurality of trenches, a thickness of the first conductive layer, and a thickness of the second conductive layer.

A third aspect of the invention includes forming an IC with a selective TCR. The method comprises: forming a first set of a plurality of trenches in a first dielectric layer; conformally depositing a first conductive layer within at least a portion of each of the trenches of the first set of a plurality of trenches, the conductive layer having a first TCR; conformally depositing a second conductive layer on at least a portion of the first conductive layer, the second conductive layer having a second TCR; and planarizing at least the first conductive layer and the second conductive layer to a top surface of the first dielectric layer, wherein the second TCR is not equal to the first TCR, such that the TCR of the IC is selected based on the dimensions of each of the trenches, a thickness of the first conductive layer, and a thickness of the second conductive layer.

The illustrated aspects of the present invention are designed to solve the problems herein discussed and/or other problems not discussed.

BRIEF DESCRIPTION OF THE DRAWINGS

These and other features of the present invention will be more readily understood form the following detailed description of the various aspects of the invention taken in conjunction with the accompanying drawings that depict various embodiments of the invention, in which.

It is noted that the drawings are not necessarily drawn to scale. The drawings are intended to depict only typical aspects of the invention, and therefore should not be rendered as limiting the scope of the disclosure. In the drawings, like numbering represents like elements among the drawings.

DETAILED DESCRIPTION

Embodiments of the present invention include an integrated circuit (IC) with a selective temperature coefficient of resistance (TCR). As referred to herein, an IC with a selective TCR is used to describe an IC where the specific TCR of the IC can be targeted. That is, the ICs described herein may be designed such that the TCR of the IC can be customized by dimensions of the trenches in the IC, and the relative TCRs of the materials used for the multi-layered structures within the trenches. While conventional ICs are generally bulky, the present invention includes multi-layered structures that tune the TCR of the IC structure formed within a trench of a dielectric layer of the IC. Thus, the present invention is less bulky because the multi-layered structures are formed within trenches, and reduce the number of layers on the IC itself. The multi-layered structures described herein may be used as a contact, interconnect or a resistor.

Figure 4:
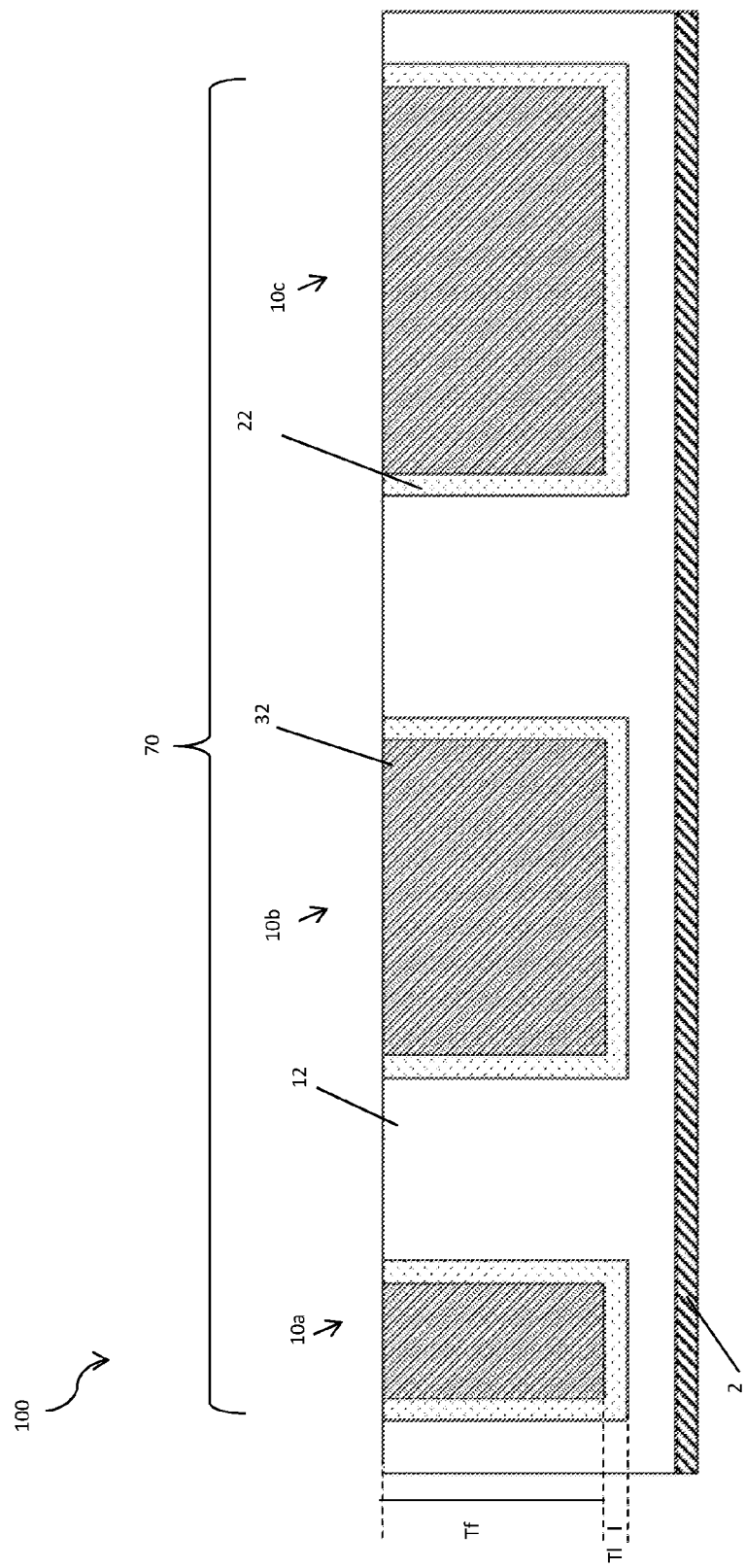
FIG. 4 shows a cross-section of the integrated circuit having two conductive layers.
Figure 6:
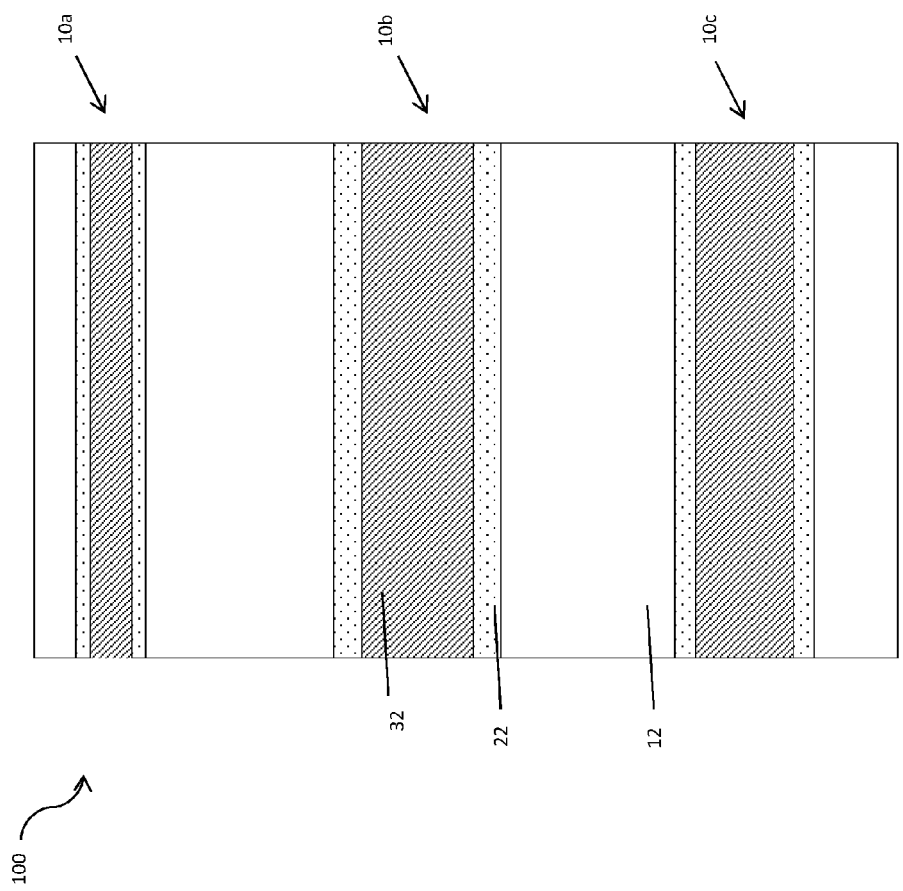
FIG. 6 shows a schematic top view of the embodiment shown in FIG. 4.

FIGS. 4 and 6 show an IC 100 with a selective temperature coefficient of resistance. IC 100 comprises a plurality of trenches 10a-10c in a dielectric layer 12, a first conductive layer 22, and a second conductive layer 32.

Figure 1:
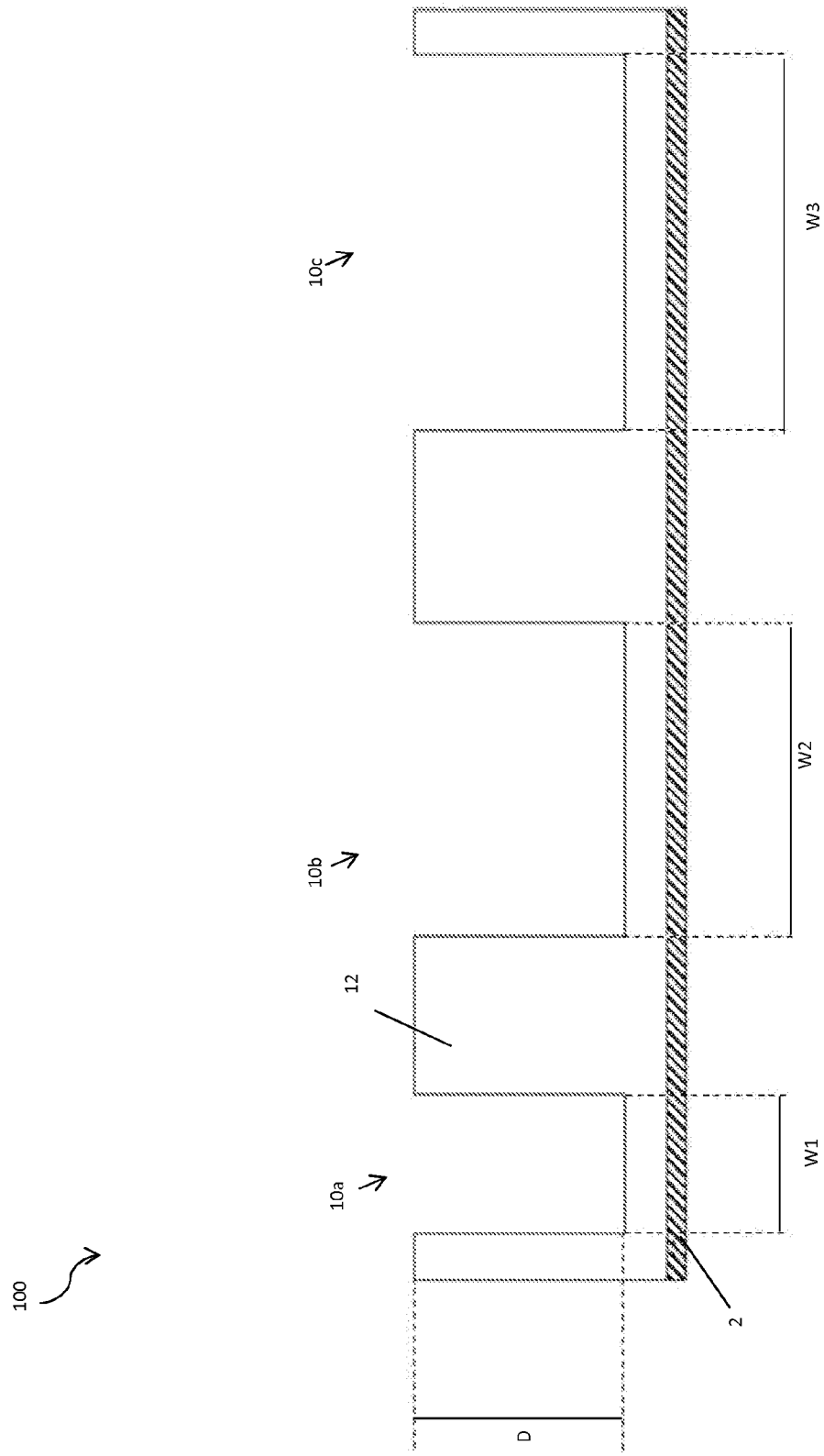
FIG. 1 shows a cross-section of a plurality of trenches formed in a dielectric layer of an integrated circuit.

Referring now to FIGS. 1-4, embodiments of a method of fabricating the embodiment of FIGS. 4 and 6 are shown in more detail. As shown in FIG. 1, a plurality of trenches 10a-10c are formed in dielectric layer 12. While FIGS. 1-4 show only a first trench 10a, a second trench 10b, and a third trench 10c, it is to be understood that there can be any number of trenches in IC 100 without departing from embodiments of the invention. Trenches 10a-10c may be formed by etching or other currently known and/or later developed techniques in the art of semiconductor manufacturing. While trenches 10a-10c are shown as being rectangular shaped, it is to be understood that trenches 10a-10c may be of any shape suitable for the application of IC 100, including but not limited to, for example, recessed, T-shaped, or triangular shaped. Trenches 10a-10c are formed to permit formation of multi-layered structures 70 (FIG. 4) therein. Additionally, plurality of trenches 10a-10c may be formed such that each trench in plurality of trenches 10a-10c include particular dimensions, e.g., a respective depth D and width W. Dimensions of each trench may vary such that one or more trenches in plurality of trenches 10a-10c may be of different from another, e.g., can include a depth D and/or width W. For example, in one embodiment, first trench 10a may have a first width W1, second trench 10b may have a second width W2, and third trench may have a third width W3. The effect of the dimension of each trench 10a-10c will be discussed further herein. As an example, widths of trenches 10a-10c may vary from 10 nm to 1300 nm.

Dielectric layer 12 may be in contact with (formed on) substrate 2. For example, dielectric layer 12 may be formed on substrate 2 using any now known or later developed deposition technique, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. It is to be understood that the use of the term "depositing" or "deposited" herein may include any of the above deposition techniques.

Substrate materials of substrate 2 may include but are not limited to: silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained.

Dielectric materials of the dielectric layer 12 may include but are not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or multiple layers thereof.

Figure 2:
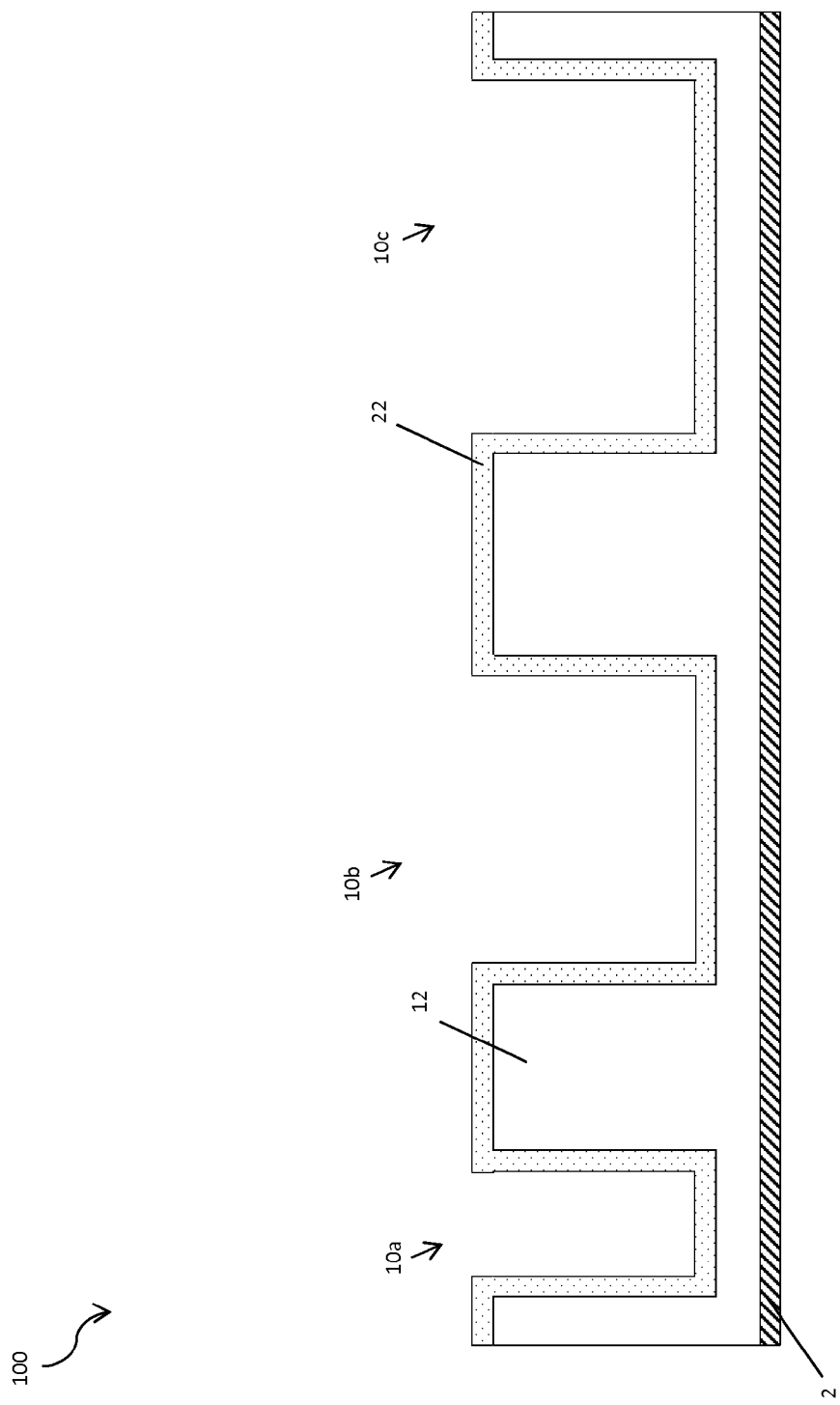
FIG. 2 shows a cross-section of the embodiment of FIG. 1 wherein a first conductive layer is deposited.
Figure 3:
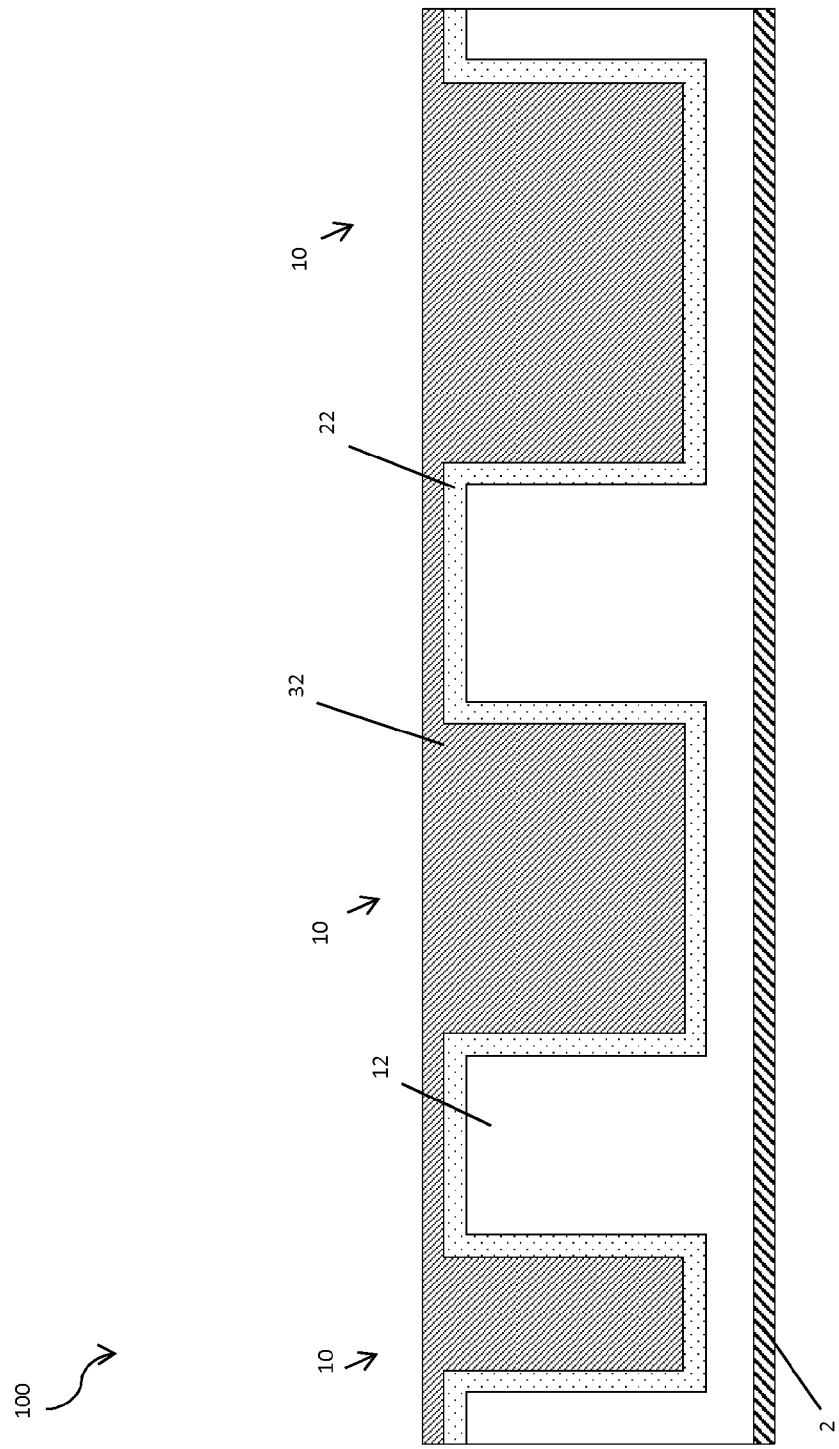
FIG. 3 shows a cross-section of the embodiment of FIG. 2 wherein a second conductive layer deposited.

As shown in FIG. 2, first conductive layer 22 may be deposited over dielectric layer 12 and within trenches 10a-10c. First conductive layer 22 may be deposited such that first conductive layer 22 conformally coats at least a portion of each trench of plurality of trenches 10a-10c. As shown in FIG. 3, second conductive layer 32 may be deposited over first conductive layer 22. Second conductive layer 32 may be deposited such that second conductive layer 32 conformally coats at least a portion of first conductive layer 22 and substantially fills trenches 10a-10c.

First and second conductive layers 22, 32 may include film conductors as are well known in the art of semiconductor manufacturing, including but not limited to, for example, aluminum (Al), zinc (Zn), indium (In), copper (Cu), indium copper (InCu), tin (Sn), tantalum (Ta), tantalum nitride (TaN), tantalum carbide (TaC) titanium (Ti), titanium nitride (TiN), titanium carbide (TiC), tungsten (W), tungsten nitride (WN), tungsten carbide (WC), and polysilicon (poly-Si). First conductive layer 22 may have a first TCR and second conductive layer 32 may have a second TCR such that the second TCR is not equal to the first TCR. For example, first conductive layer 22 may have a positive TCR and second conductive layer 32 may have a negative TCR or vice versa. Alternatively, first conductive layer 22 may have first positive TCR and second conductive layer 32 may have a second positive TCR such that first positive TCR and second positive TCR are not equal. The same could be said wherein first conductive layer 22 has a first negative TCR and second conductive layer 32 has a second negative TCR.

Referring to FIGS. 2 and 3 together, First conductive layer 22 may be deposited such that it has a first thickness and second conductive layer 32 may be deposited such that it has a second thickness. In one embodiment, first conductive layer 22 may be approximately half as thick as width W of trench 10, and second conductive layer 32 may be sized to substantially fill (i.e., any amount of filling that is functionally indistinguishable from complete (100%) filling during operation) the remainder of trench 10. In an embodiment, first conductive layer 22 may have a thickness of 1 nm to 200 nm and second conductive layer 32 may have a thickness of 10 nm to 1000 nm, depending on the physical scale of the technology node, and the desired tuning ranges. In another embodiment, the ratio of first and second conductive layers 22, 32 that fill trenches 10a-10b can depend on width W1-W3 of trenches 10a-10c. For example, first width W1 may be less than second width W2, and second width W2 may be less than third width W3. In this embodiment, first conductive layer 22 may have a thickness Tl in third trench 10c that is less than one-fourth of third width W3. In second trench 10b, first conductive layer 22 may have a thickness Tl that is less than one-third of second width W2. In first trench 10a, first conductive layer 22 may have a thickness Ti that is equal to or greater than one-third of first width W1. In this embodiment, second conductive layer 32 can substantially fill the remainder of first trenches 10a-c.

First and second conductive layers 22, 32 together in each trench 10a-10c may comprise a set of multi-layered structures 70 having a selective TCR (FIG. 4). The thicknesses of the first and second conductive layers 22, 32 coupled with the first and second TCRs determine the overall TCR of IC 100. That is, the amount deposited of each of the conductive layers 22, 32, each having a respective TCR, determines the overall TCR of IC 100. As such, the dimensions of trenches 10a-10c, including depth D and width W, may influence the overall TCR since larger trench dimensions may result in a greater amount of first and second conductive layers 22, 32 required to fill trenches 10a-10c.

As discussed herein, a targeted TCR may be selected based on the dimension of trenches 10a-10c, a thickness of the first conductive layer 22 having a first TCR, and a thickness of the second conductive 32 layer having a second TCR. TCR may be expressed in units of fractional change of electrical resistance per temperature (K). A targeted TCR may range from −0.005/K to +0.005/K, however the TCR may also be target outside this range. A targeted TCR may be represented by the following formula:

$$TCR = (1/R) dR/dT = (Rl^2 \times Rf' + Rf^2 \times Rl')/[R \times Rf \times (Rl + Rf)]$$

Where:
R is the electrical resistance of the multi-layered structure of length L and width W, at nominal temperature,
L is the length of the multi-layered structure
W is the width of the multi-layered structure
D is the depth of the trench
Rhol is the specific resistivity of the first conductive layer material (typically specified in units of Ohm-cm)
Rhof is the specific resistivity of the second conductive layer material (typically specified in units of Ohm-cm)
$Rl = L/Al \times Rhol$
$Rf = L/Af \times Rhof$
$Rl' = L/Al \times dRhol/dT$
$Rf = L/Af \times dRhof/dT$
$Al = (2D + W − 2Tl) \times Tl$
$Af = (D − Tl) \times (W − 2Tl)$
Tl is the first conductive layer thickness Once first and second conductive layers 22, 32 have been deposited, IC 100 may undergo a planarization technique such as chemical-mechanical polishing (CMP). That is, at least first and second conductive layers 22, 32 may be planarized to a top surface of dielectric layer 12 as shown in FIGS. 4 and 6. FIG. 6 shows a schematic top view of the embodiment including first and second conductive layers 22, 32. IC 100 may be used as a set of resistor elements.

Figure 5:
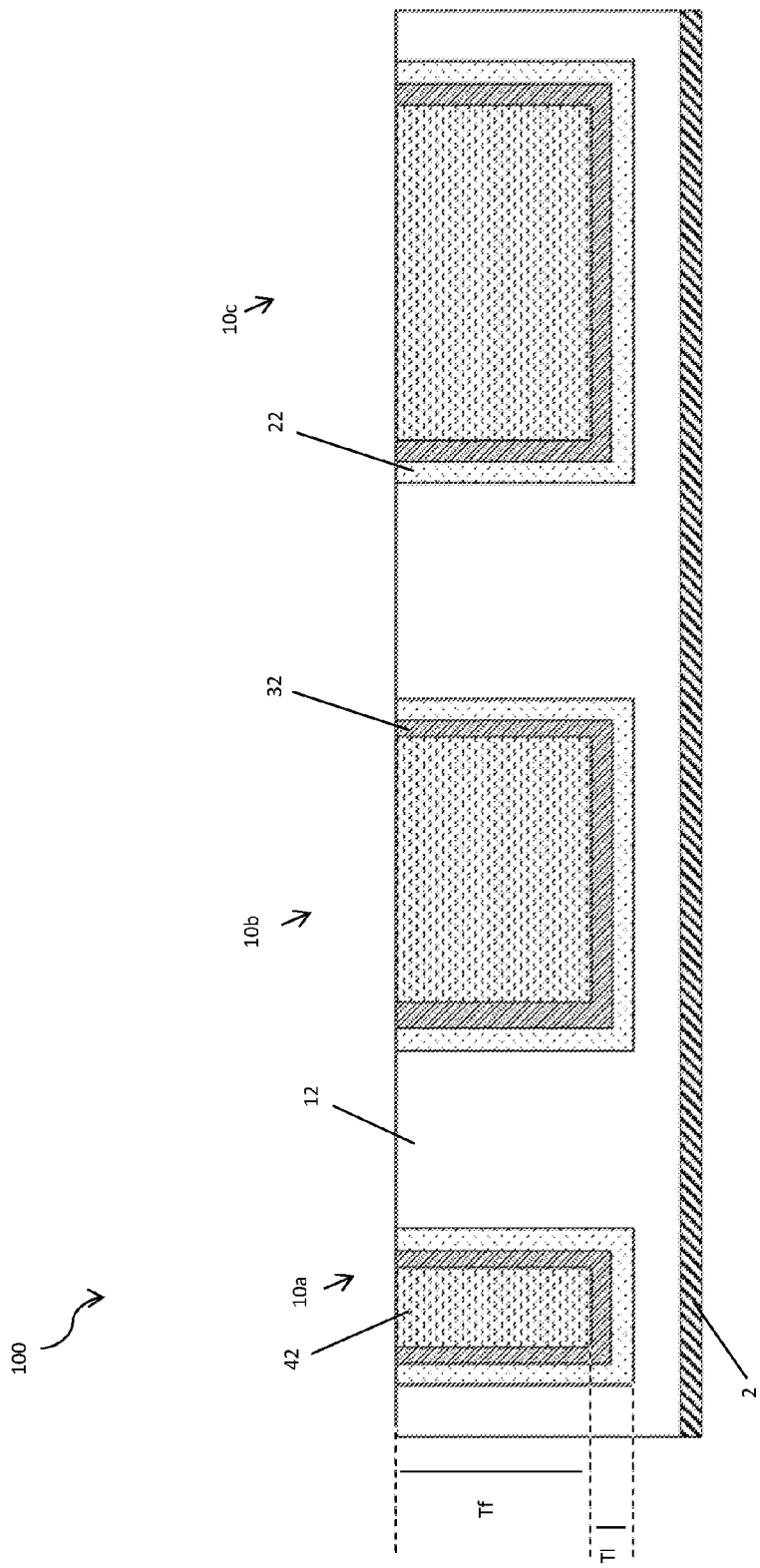
FIG. 5 shows a cross-section of the integrated circuit having three conductive layers.

As shown in FIG. 5, in another embodiment, IC 100 may include a plurality of trenches 10a-10c in a dielectric layer 12, a first conductive layer 22, a second conductive layer 32, and a third conductive layer 42. The method of fabricating this embodiment of the invention is substantially similar to the steps as described with respect to FIGS. 1-4. That is, dielectric layer 12 may be deposited on substrate 2. A plurality of trenches 10a-10c may be formed in dielectric layer 12. A first conductive layer 22 may be deposited such that it conformally coats at least a portion of trenches 10a-10c. A second conductive layer 32 may be deposited such that it conformally coats at least a portion of first conductive layer 22. However, prior to planarizing first and second conductive layers 22, 32, third conductive layer 42 may be deposited such that it conformally coats at least a portion of second conductive layer 32 and substantially fills trenches 10a-10c. As such, the planarizing step may further include planarizing first conductive layer 22, second conductive layer 32, and third conductive layer 42 to a top surface of the dielectric layer 12. It is to be understood that the IC circuits described herein are not limited to two or three conductive layers to fill trenches. That is, the IC circuits herein may include any number of layers to fill trenches without departing from aspects of the invention.

Third conductive layer 42 may include any of the materials discussed herein relative to first and second conductive layers 22, 32. Third conductive layer 42 may have a third TCR with a value different from the first and/or the second TCR. First, second, and third conductive layers 22, 32, 42 together in each trench 10a-10c may form a set of multi-layered structures 70 with a selective TCR. In this embodiment, the TCR of IC 100 is determined by the properties of materials used therein, e.g., the first TCR, the second TCR, the third TCR, and the thicknesses of first, second, and third conductive layers 22, 32, 42 as discussed above relative to FIGS. 4 and 6. In one embodiment, first conductive layer 22 and second conductive layer 32 may be approximately half as thick as width W of trench 10 (FIG. 1), and third 42 conductive layer may be sized to substantially fill the remainder of trench 10. First conductive layer 22 and second conductive layer 32 may together have a thickness of 1 nm to 200 nm and second conductive layer 32 may have a thickness of 10 nm to 1000 nm, depending on the physical scale of the technology node, and the desired tuning ranges. In another embodiment, the ratio of first, second, and third conductive layers 22, 32, 42 that fill trenches 10a-10b can depend on width W1-W3 of trenches 10a-10c. For example, first width W1 may be less than second width W2, and second width W2 may be less than third width W3. In this embodiment, first conductive layer 22 and second conductive layer 32 may together have a thickness Tl in third trench 10c that is less than one-fourth of third width W3. In second trench 10b, first and second conductive layers 22, 32 may together have a thickness Tl that is less than one-third of second width W2. In first trench 10a first and second conductive layers 22, 32 may have a thickness Ti that is equal to or greater than one-third of first width W1. In this embodiment, third conductive layer 42 can substantially fill the remainder of first trenches 10a-c. The formula described previously to calculate the TCR of IC 100 may also be used to calculate the TCR of the embodiment shown in FIG. 5. In this embodiment, dRl/dT would be representative of the combined first and second conductive layers 22, 32.

Figure 7:
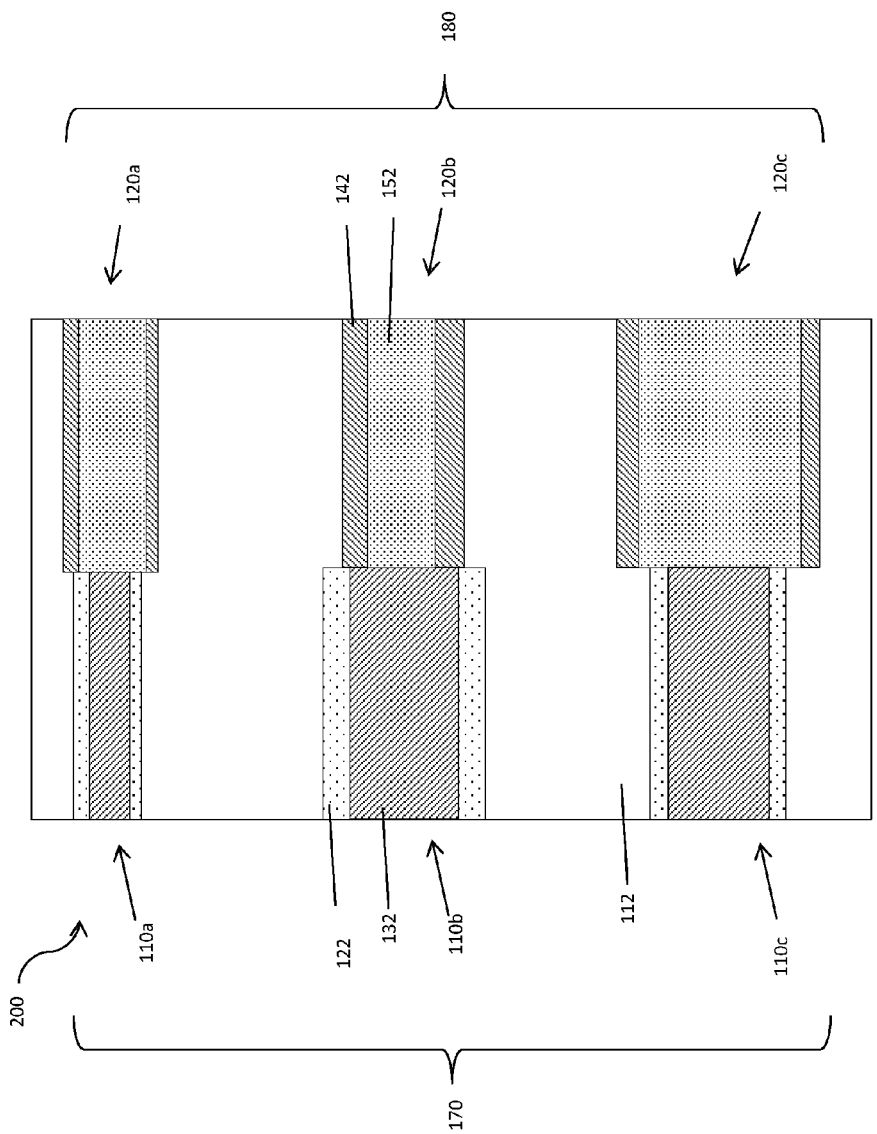
FIG. 7 shows a schematic top view of the integrated circuit having a plurality of multi-layered structures in series.
Figure 8:
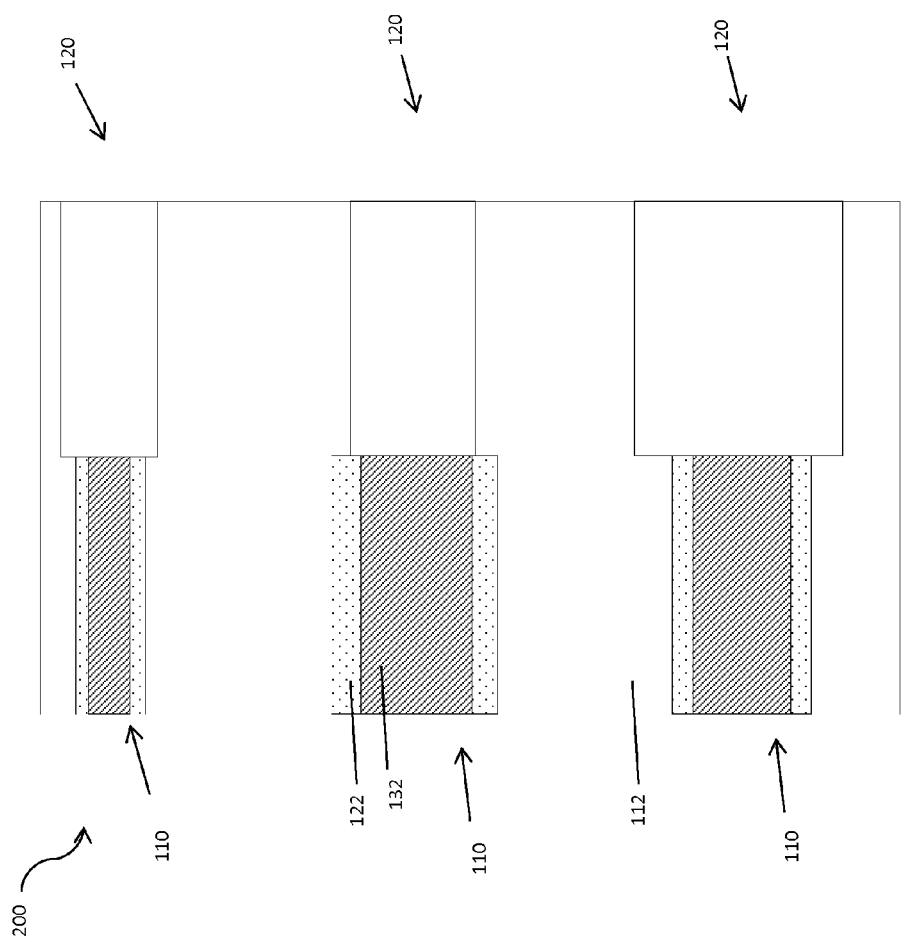
FIG. 8 shows a schematic top view of the integrated circuit wherein the plurality of trenches are patterned.

FIG. 7 shows a schematic top view of another embodiment of the invention. Here, an IC 200 may include a first set of a plurality of trenches 110 formed in a dielectric layer 112 and a second set of a plurality of trenches 120 formed in dielectric layer 112 such that each of the trenches in the second set of trenches 120 is adjacent to a respective trench in the first set of a plurality of trenches 110. In this embodiment, as previously discussed herein, first set of a plurality of trenches 110 may be formed in dielectric layer 112. A first conductive layer 122 may be deposited within trench such that it conformally coats at least a portion of each of the trenches in the plurality of trenches 110. A second conductive layer 132 may be deposited such that it conformally coats at least a portion of first conductive layer 122 and substantially fills each trench of the first set of a plurality of trenches 110. First set of a plurality of trenches 110 may be patterned to remove first and second conductive layers 122, 132 from a portion of each trench in first set of a plurality of trenches 110 and to form a second set of a plurality of trenches 120 (FIG. 8). A third conductive layer 142 may be deposited in the portion of each trench of the second set of a plurality of trenches 120 that was patterned. That is, third conductive layer 142 may be deposited such that it conformally coats at least a portion of each of the trenches in second set of a plurality of trenches 120. A fourth conductive layer 152 may be deposited such that it conformally coats at least a portion of third conductive layer 142. IC 200 may further undergo a planarization step such that third and fourth conductive layers 142, 152 are planarized to a top surface of dielectric layer 112, as shown in FIG. 7.

Third and fourth conductive layers 142, 152 may include any of the materials previously discussed herein. Third conductive layer 142 may have a third TCR and fourth conductive layer 152 may have a fourth TCR such that the first TCR, the second TCR, the third TCR, and the fourth TCR are not equal to each other. Alternatively, first TCR and second TCR may be equal to each other while second TCR and fourth TCR may be equal to each other. It is to be understood that the respective TCR of each conductive layer may be chosen based on the selected or desired TCR of IC 200. For example, the conductive layer materials may be chosen in any combination such that at least two of the conductive layers have a different TCR. Each respective TCR may be positive or negative as previously discussed. First and second conductive layers 122, 132 together may comprise a first set of multi-layered structures 170 having a selective TCR and third and fourth conductive layers 142, 152 may comprise a second set of multi-layered structures 180 having a selective TCR (FIG. 7). The first and second sets of multi-layered structures 170, 180 may be connected in series. The TCR of IC 200 therefore is determined by the first TCR, the second TCR, the third TCR, the fourth TCR and the relative thicknesses of first conductive layer 122, second conductive layer 132, third conductive layer 142, and fourth conductive layer 152. Additionally, the dimensions (for example, depth D and width W shown in FIG. 1) of the trenches in each of first set of a plurality of trenches 110a-110c and second set of a plurality of trenches 120a-120c may influence the TCR of the IC 200. It will be understood by one skilled in the art that the above formula is can be extended to the case with multiple layers by representing the composite by an equivalent effective resistivity, Rl, and temperature sensitivity, dRl/dT of layered films.

Figure 9:
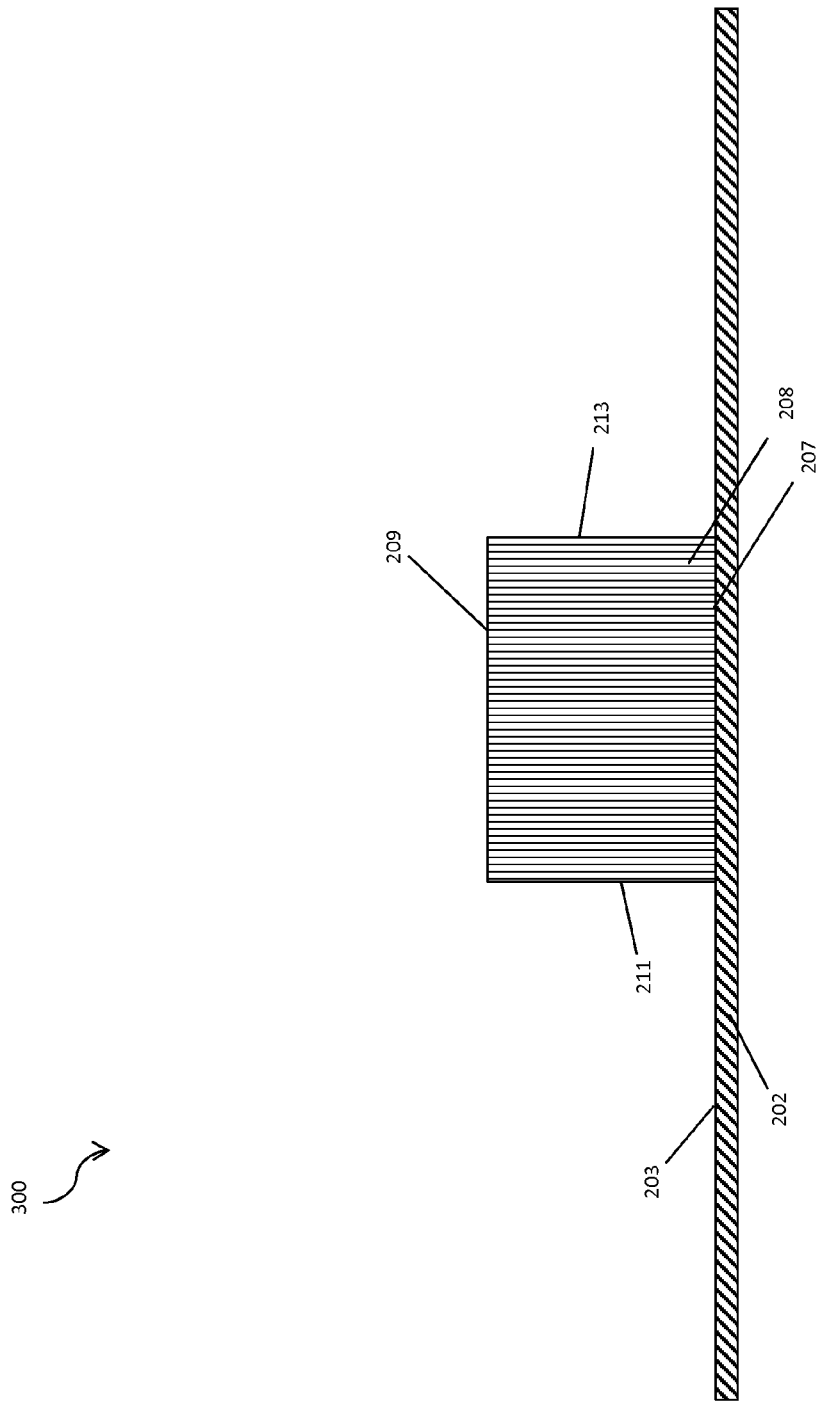
FIG. 9 shows a cross-section of a semiconductor fin on a substrate.
Figure 10:
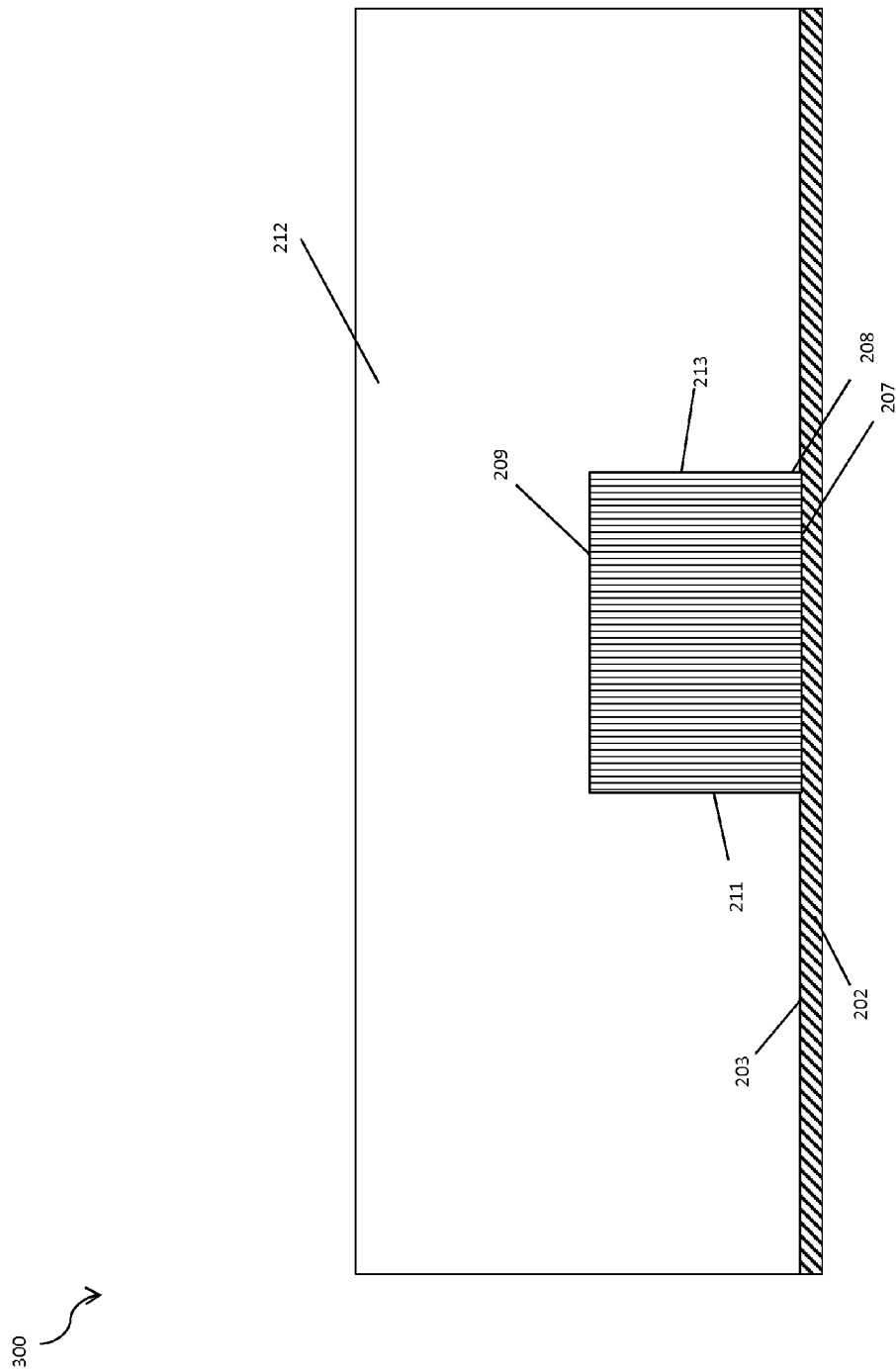
FIG. 10 shows a cross-section of the embodiment in FIG. 9 wherein a dielectric layer is deposited.

FIGS. 9-16 show another embodiment of the invention wherein IC 300 includes a semiconductor fin 208. In one cross-section, semiconductor fin 208 may include a bottom surface 207, a top surface 209, a first sidewall 211, and a second sidewall 213. Semiconductor fin 208 may be formed on a substrate 202 such that bottom surface 207 of semiconductor fin 208 contacts a top surface 203 of substrate 202 (FIG. 9). Semiconductor fin 208 may be part of a silicon-on-insulator (SOI) layer, which can include silicon, silicon germanium, or any suitable semiconductor material. Semiconductor fin 208 may be formed via conventional etching and masking techniques known in the art of semiconductor manufacturing. While only a single semiconductor fin 208 is shown, it is to be understood that IC 300 may include a plurality of semiconductor fins.

A dielectric layer 212 may be deposited on substrate 202 and semiconductor fin 208. Dielectric layer 212 may be deposited as described herein relative to FIGS. 1-4. Additionally, dielectric layer 212 and substrate 202 may include any of the materials described herein relative to FIGS. 1-4.

Figure 11:
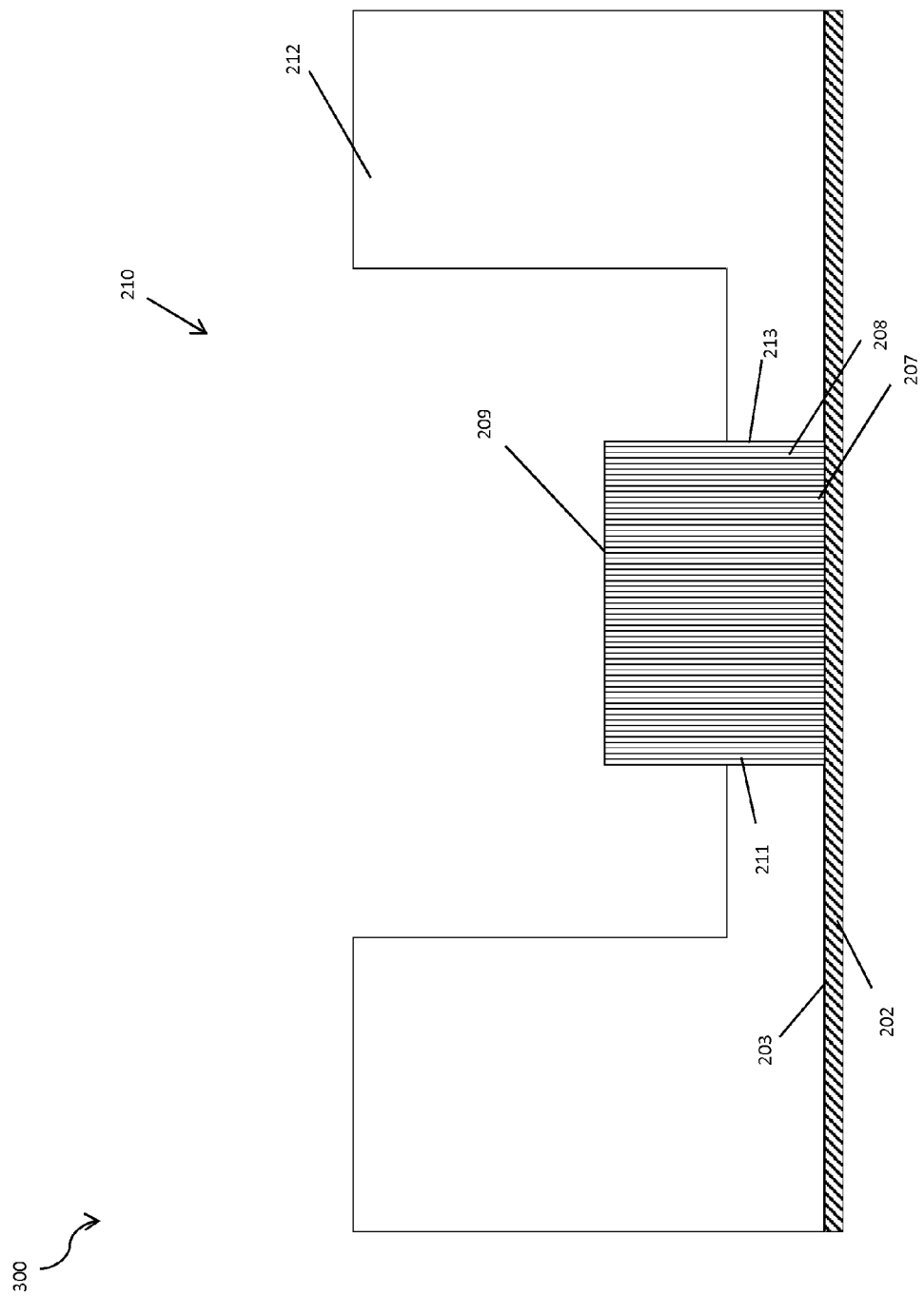
FIG. 11 shows a cross-section of the embodiment in FIG. 10 wherein a trench is formed in the dielectric layer.

As shown in FIG. 11, a trench 210 may be formed in dielectric layer 208 using techniques previously discussed herein. Trench 210 may be formed such that it extends in a direction that is substantially perpendicular to a direction of extension of semiconductor fin 208. While FIG. 11 shows only a single trench, it is to be understood that this embodiment may include a plurality of trenches as will later be described. In this embodiment, trench 210 may be formed such that it exposes a surface of semiconductor fin 208 that is opposite substrate 202, i.e. top surface 209, a substantial portion of a first sidewall 211 and a substantial portion of a second sidewall 213 of semiconductor fin 208.

Figure 12:
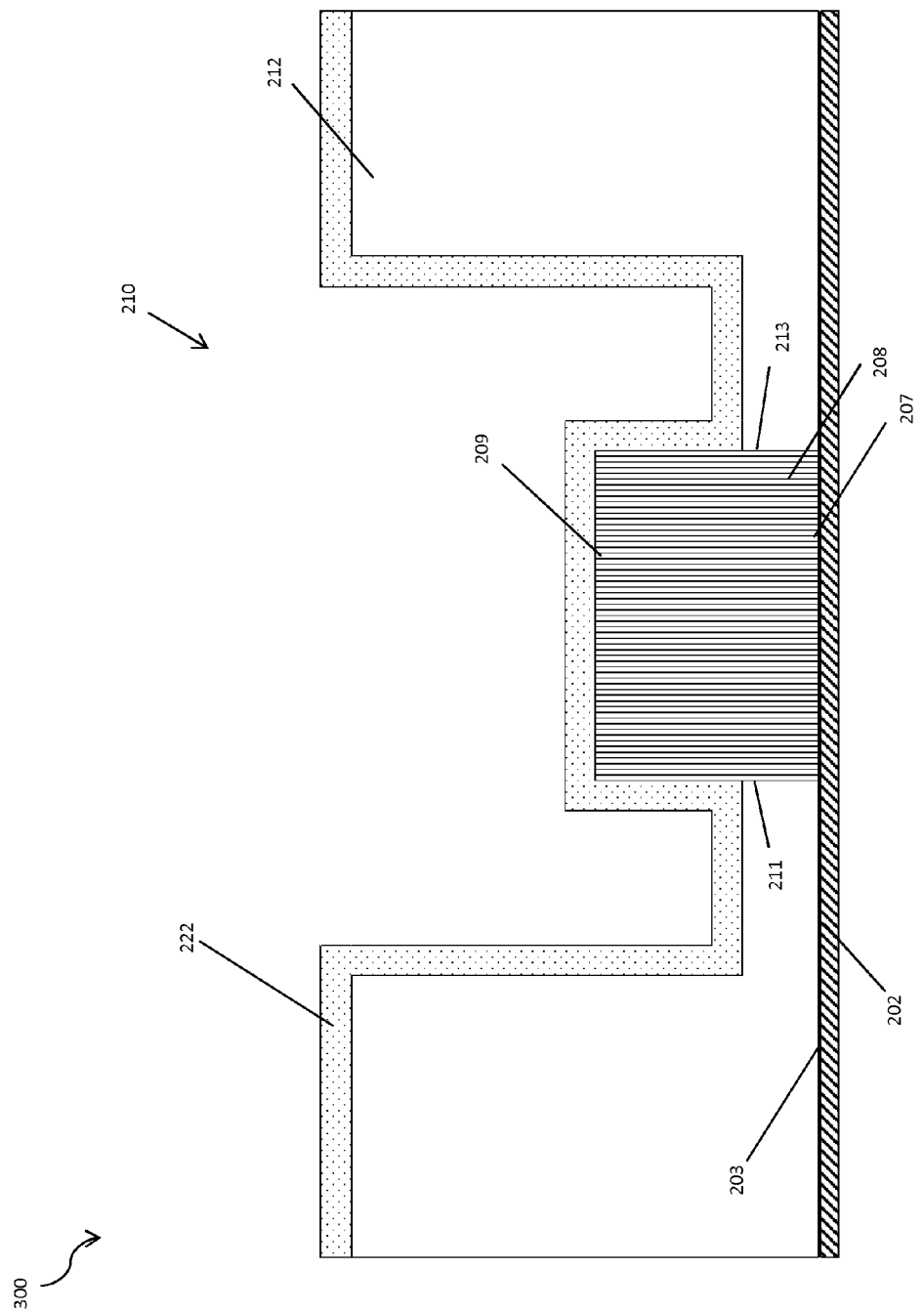
FIG. 12 shows a cross-section of the embodiment in FIG. 11 wherein a first conductive layer is deposited.

As shown in FIG. 12, first conductive layer 222 may be deposited over IC 300 such that first conductive layer 222 covers dielectric layer 212 including within trench 210. That is, first conductive layer 222 may substantially surround semiconductor fin 208 such that top surface 209, a substantial portion of first sidewall 211 and a substantial portion of second sidewall 213 of semiconductor fin 208 are in adjacent to the with first conductive layer 222. First conductive layer 222 may include a first TCR. In one embodiment, greater than 90% of the fin sidewalls may be adjacent to the first conductive layer.

Figure 13:
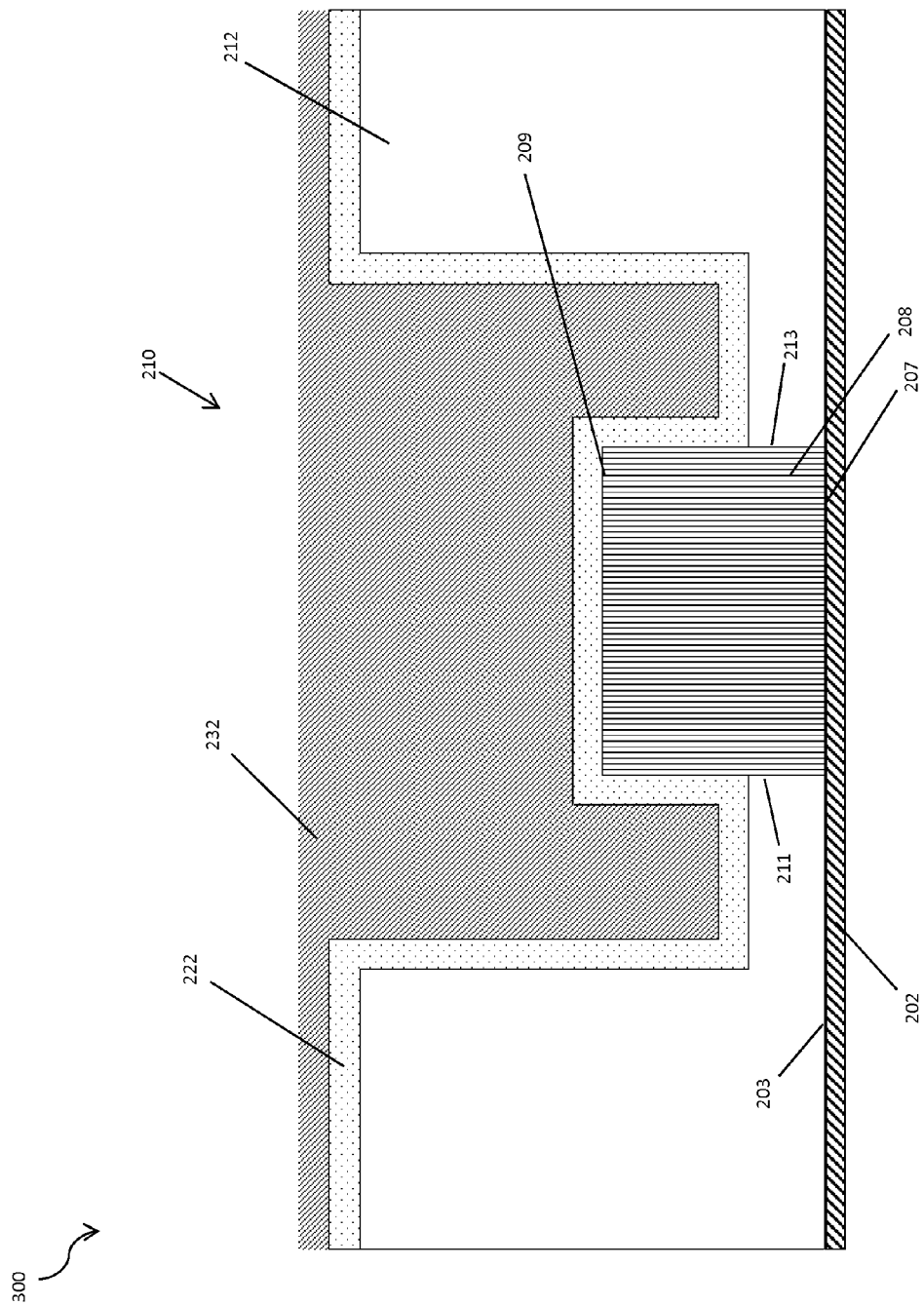
FIG. 13 shows a cross-section of the embodiment in FIG. 12 wherein a second conductive layer is deposited.

As shown in FIG. 13, second conductive layer 232 may be deposited over first conductive layer 222. Second conductive layer 232 may be deposited such that second conductive layer 232 conformally coats at least a portion of first conductive layer 222 and substantially fills trench 210. Second conductive layer 232 may include a second TCR such that second TCR is not equal to first TCR.

Figure 14:
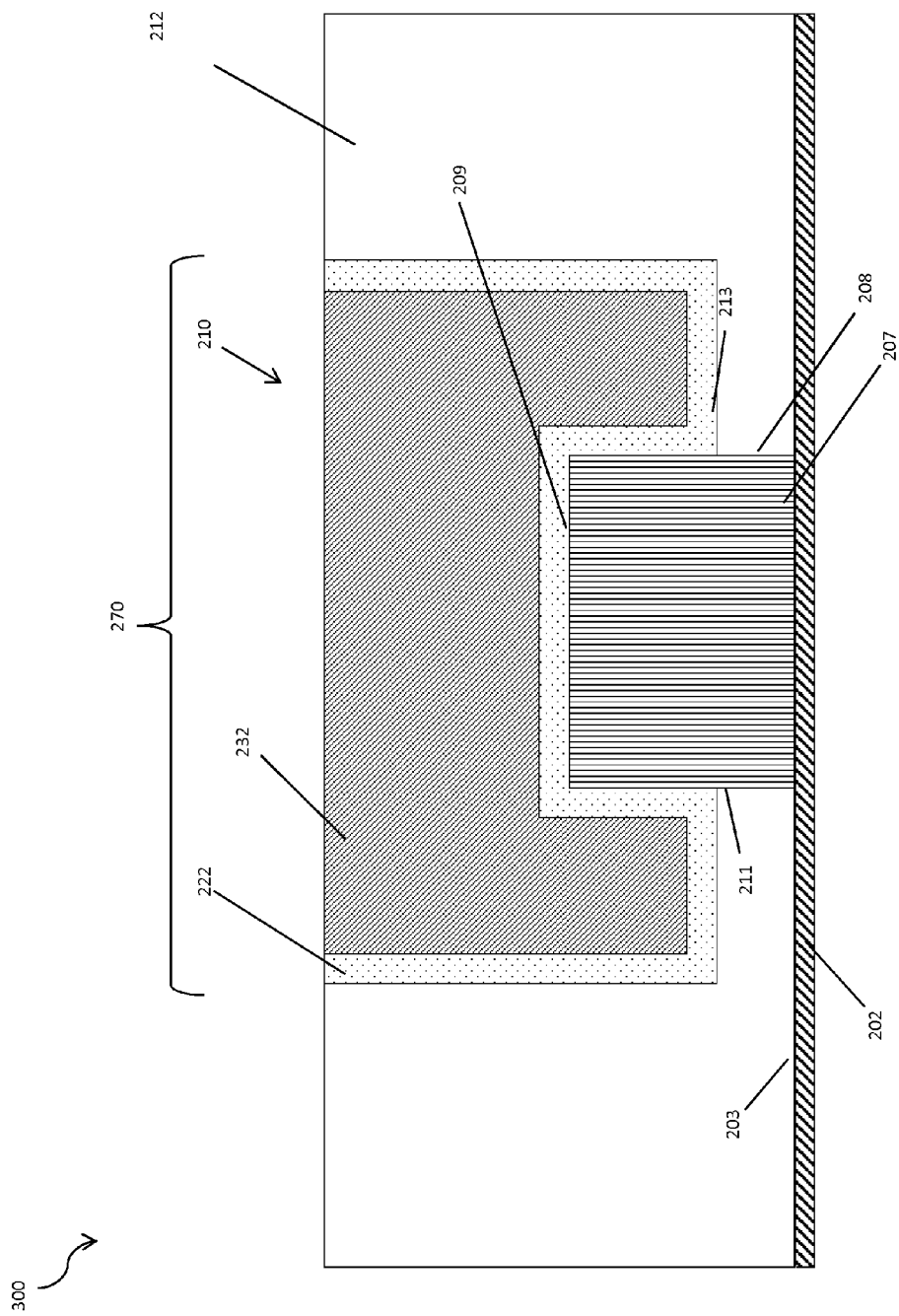
FIG. 14 shows a cross-section of the embodiment in FIG. 13 wherein the integrated circuit is planarized.

First conductive layer 222 may be deposited such that it has a first thickness and second conductive layer 232 may be deposited such that it has a second thickness. First and second conductive layers 222, 232 together may comprise a multi-layered structure 270 having a selective TCR (FIG. 14). The thicknesses of the first and second conductive layers 222, 232 coupled with the first and second TCRs determine the overall TCR of the IC 300. That is, the amount deposited of each of the conductive layers 222, 232, each having a respective TCR, determines the overall TCR of IC 300. Additionally, the dimensions of trench 210 may influence the TCR of IC 300.

Figure 15:
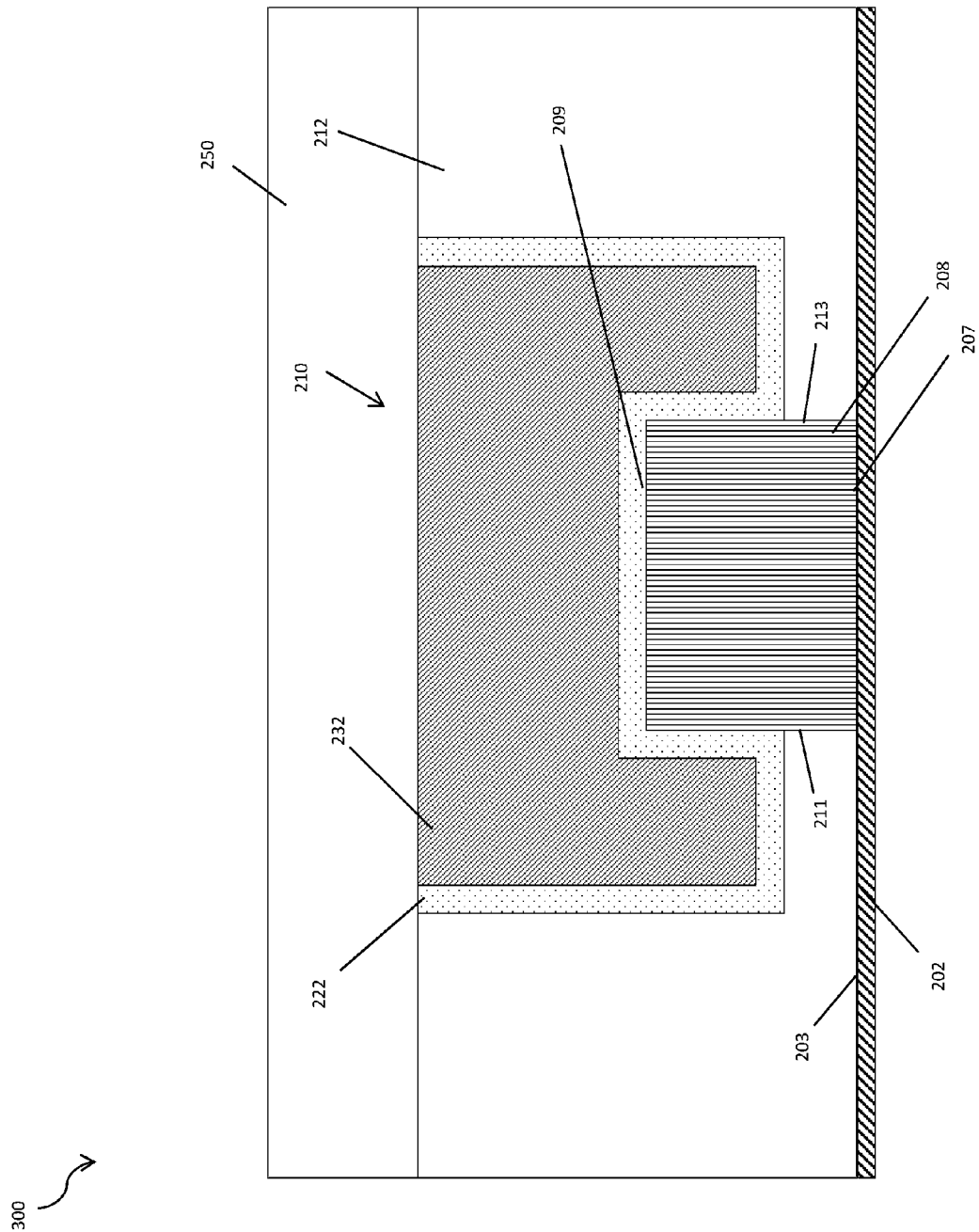
FIG. 15 shows a cross-section of the embodiment in FIG. 13 wherein an interlevel dielectric layer is deposited.
Figure 16:
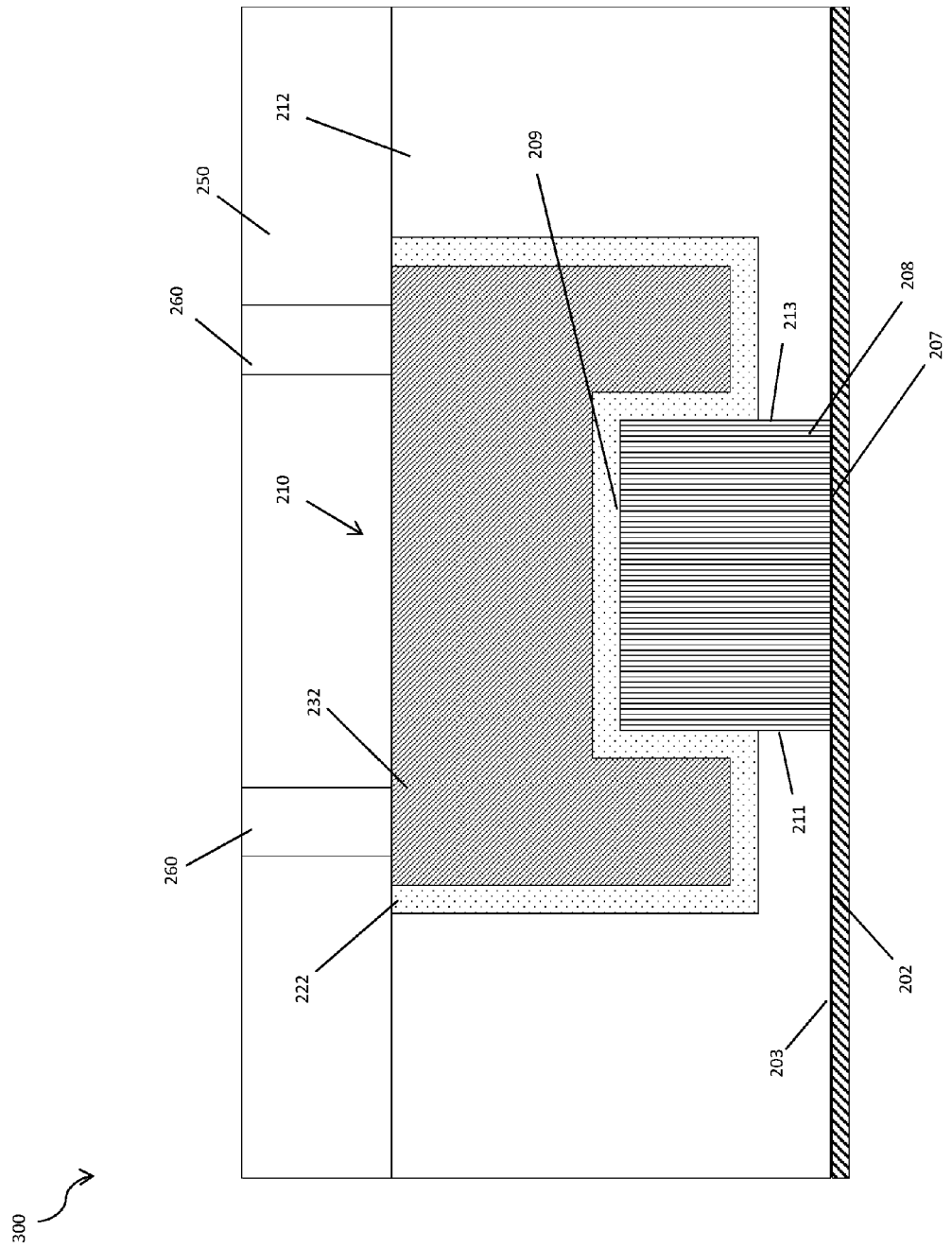
FIG. 16 shows a cross-section of the embodiment in FIG. 14 wherein a set of vias are formed in the interlevel dielectric layer over the trench.

As shown in FIG. 14, IC 300 may undergo a planarization technique such as chemical-mechanical polishing (CMP). That is, at least first and second conductive layers 222, 232 may be planarized to a top surface of dielectric layer 212. Further, as shown in FIG. 15, an interlevel dielectric layer 250 may be deposited on IC 300 such that it covers dielectric layer 212, and first and second conductive layers 222, 232 within trench 210. Interlevel dielectric layer 250 may include any of the dielectric materials previously discussed herein. Additionally, a set of vias 260 may be formed in interlevel dielectric layer 250 as shown in FIG. 16. Vias 260 may be formed within interlevel dielectric layer 250 to expose trench 210. Vias 260 may be formed by well-known techniques in the art of semiconductor manufacturing. Vias 260 may include an electrically conducting stack including TiN, Ti, TiC, Cu, Al, and W (not shown). Where IC 300 is used as a resistor, vias 260 may serve as contacts for the resistor.

Figure 17:
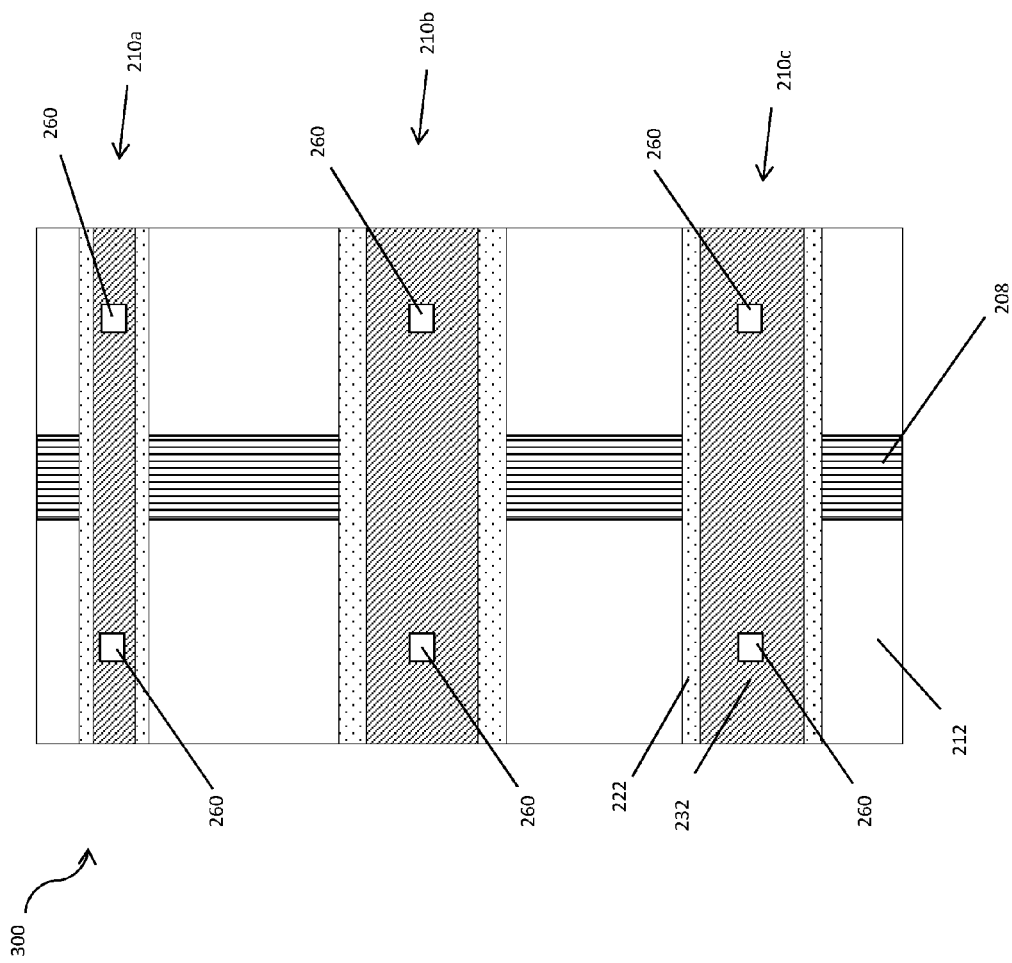
FIG. 17 shows a schematic of a top view of the embodiment in FIG. 16 wherein there is a plurality of trenches.

FIG. 17 shows a schematic top view of the embodiment of FIGS. 9-16 including a plurality of trenches 210a-210c. In this embodiment, the plurality of trenches 210a-210c are formed such that each trench substantially perpendicularly crosses the semiconductor fin 208. Additionally, each trench in this embodiment includes a respective set of vias 260, which may, for example, serve as contacts for resistors. It is to be understood that interlevel dielectric layer 250 is not shown in FIG. 17 for clarity and that vias 260 are actually formed in interlevel dielectric layer 250 as shown in FIG. 16.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments, the practical application or technical improvement over technologies found in the marketplace, or to enable others of ordinary skill in the art to understand the embodiments disclosed herein.

The invention claimed is:

1. An integrated circuit (IC) with a selective temperature coefficient of resistance (TCR), the IC comprising,
   a first resistor having a first trench in a dielectric layer, the first trench having a first width;
   a second resistor having a second trench in the dielectric layer, the second trench having a second width not equal to the first width;
   a first conductive layer coating at least a portion of each of the first trench and the second trench, the first conductive layer having a first TCR; and
   a second conductive layer coating at least a portion of the first conductive layer in each of the first trench and the second trench, the second conductive layer having a second TCR,
   wherein the second TCR is not equal to the first TCR, and
   wherein the TCR of the IC is selected based on a dimension of the first trench, a dimension of the second trench, a thickness of the first conductive layer, and a thickness of the second conductive layer.

2. The IC of claim 1, wherein the first conductive layer in the second trench has a thickness that is less than one-third of the second width,
   wherein the first conductive layer in the first trench has a thickness equal to or greater than one-third of the first width, and
   wherein the second conductive layer substantially fills the remainder of the first trench and the second trench.

3. The IC of claim 1, further comprising a third conductive layer coating at least a portion of the second conductive layer, the third conductive layer having a third TCR, wherein the third TCR is not equal to the second TCR or the first TCR.

4. The IC of claim 3, wherein the first conductive layer and the second conductive layer in the second trench together have a thickness that is less than one-third of the second width,
   wherein the first conductive layer and the second conductive layer in the first trench together have a thickness equal to or greater than one-third of the first width, and
   wherein the third conductive layer substantially fills the remainder of the first trench and the second trench.

5. The IC of claim 1, wherein the first TCR is positive and the second TCR is negative, or the first TCR is negative and the second TCR is positive.

6. The IC of claim 1, further comprising;
   a semiconductor fin formed in the dielectric layer, the semiconductor fin being substantially perpendicular to the trench and having a bottom surface, a top surface, a first sidewall, and a second sidewall,
   wherein the bottom surface of the semiconductor fin contacts a substrate positioned beneath the dielectric layer, and
   wherein the trench substantially surrounds the semiconductor fin such that the top surface, a substantial portion of a first sidewall and a substantial portion of a second sidewall contact the first conductive layer.

7. An integrated circuit (IC) comprising,
   a first set of a plurality of trenches in a dielectric layer; and
   a first set of multi-layered structures, each multi-layered structure of the first set of the multi-layered structures in a respective trench of the first set of a plurality of trenches and including:
      a first conductive layer coating at least a portion of the respective trench in the first set of a plurality of trenches, the first conductive layer having a first temperature coefficient of resistance (TCR), and
      a second conductive layer coating at least a portion of the first conductive layer, the second conductive layer having a second TCR,
      wherein the second TCR is not equal to the first TCR, and
   wherein the TCR of the IC is selected based on dimensions of each of the trenches in the first set of a plurality of trenches, a thickness of the first conductive layer, and a thickness of the second conductive layer.

8. The IC of claim 7, wherein the first set of a plurality of trenches includes at least a first trench having a first width and a second trench having a second width, and wherein the first width does not equal the second width,
   wherein the first conductive layer in the second trench has a thickness that is less than one-third of the second width,
   wherein the first conductive layer in the first trench has a thickness equal to or greater than one-third of the first width, and
   wherein the second conductive layer substantially fills the remainder of the first trench and the second trench.

9. The IC of claim 7, further comprising:
   a second set of a plurality of trenches formed in the dielectric layer such that each of the trenches in the second set of a plurality of trenches is adjacent to a respective trench in the first set of a plurality of trenches; and
   a second set of multi-layered structures, each multi-layered structure of the second set of the multi-layered structures being formed in a respective trench of the second set of a plurality of trenches and including:
      a third conductive layer coating at least a portion of the respective trench in the second set of a plurality of trenches, the third conductive layer having a third TCR; and
      a fourth conductive layer coating at least a portion of the third conductive layer, the fourth conductive layer having a fourth TCR, wherein each multi-layered structure in the second set of multi-layered structures is connected in series to a respective multi-layered structure in the first set of multi-layered structures.

10. The IC of claim 9, wherein the first TCR, the second TCR, the third TCR, and the fourth TCR are not equal to each other.

11. The IC of claim 9, wherein the first set of a plurality of trenches includes at least a first trench having a first width, and a second trench having a second width,
wherein the second set of a plurality of trenches includes at least a third trench having a third width, and a fourth trench having a fourth width, and
wherein the first width, the second width, the third width, and the fourth width are not equal to each other.

12. The IC of claim 7, further comprising a third conductive layer coating at least a portion of the second conductive layer, the third conductive layer having a third TCR, wherein the third TCR is not equal to the second TCR or the first TCR, and
wherein the first set of a plurality of trenches includes, at least a first trench having a first width and a second trench having a second width, and wherein the first width does not equal the second width,
wherein the first conductive layer and the second conductive layer in the second trench together have a thickness that is less than one-third of the second width of second trench, and
wherein the first conductive layer and the second conductive layer in the first trench together have a thickness equal to or greater than one-third of the first width of first trench, and
wherein the third conductive layer substantially fills the remainder of the first trench and the second trench.

13. The IC of claim 7, wherein the first TCR is positive and the second TCR is negative, or the first TCR is negative and the second TCR is positive.

14. The IC of claim 7, wherein the first set of multi-layered structures includes a contact, an interconnect or a resistor.

15. The IC of claim 7, further comprising,
a semiconductor fin formed in the dielectric layer, the semiconductor fin being substantially perpendicular to each trench in the first set of a plurality of trenches and having a bottom surface, a top surface, a first sidewall, and a second sidewall,
wherein the bottom surface of the semiconductor fin contacts a substrate positioned beneath the dielectric layer, and
wherein each trench substantially surrounds the semiconductor fin such that the top surface, a substantial portion of a first sidewall, and a substantial portion of a second sidewall contact the first conductive layer.

16. A method for forming an integrated circuit (IC) with a selective temperature coefficient of resistance (TCR), the method comprising,
forming a first set of a plurality of trenches in a first dielectric layer;
conformally depositing a first conductive layer within at least a portion of each of the trenches of the first set of a plurality of trenches, the first conductive layer having a first TCR;
conformally depositing a second conductive layer on at least a portion of the first conductive layer, the second conductive layer having a second TCR; and
planarizing at least the first conductive layer and the second conductive layer to a top surface of the first dielectric layer,
wherein the second TCR is not equal to the first TCR, such that the TCR of the IC is selected based on dimensions of each of the trenches, a thickness of the first conductive layer, and a thickness of the second conductive layer.

17. The method of claim 16, further comprising, conformally depositing a third conductive layer on at least a portion of the second conductive layer prior to the planarizing, the third conductive layer having a third TCR, and
wherein the planarizing further includes planarizing the third conductive layer to the top of the first dielectric layer.

18. The method of claim 17, further comprising,
patterning a portion of the first set of a plurality of trenches to selectively remove the first conductive layer and the second conductive layer,
conformally depositing a third conductive layer within the portion of the first set of a plurality of trenches that was patterned, the third conductive layer having a third TCR; and
conformally depositing a fourth conductive layer on at least a portion of the third conductive layer, the fourth conductive layer having a fourth TCR,
wherein the planarizing further includes planarizing the third conductive layer and the fourth conductive layer to the top of the first dielectric layer,
wherein the TCR of the IC derives from a dimension of each trench in the first and second sets of a plurality of trenches, a thickness of the first conductive layer, a thickness of the second conductive layer, a thickness of the third conductive layer, and a thickness of the fourth conductive layer.

19. The method of claim 16, further comprising:
patterning at least one semiconductor fin on a substrate, such that a bottom surface of the fin contacts a top surface of the substrate prior to the forming the first set of a plurality of trenches;
depositing the first dielectric layer to a height above a height of the semiconductor fin, such that the semiconductor fin is substantially surrounded by the first dielectric layer,
wherein forming the first set of a plurality of trenches includes forming the first of set of the plurality of trenches such that each trench crosses the at least one semiconductor fin substantially perpendicularly.

20. The method of claim 19, further comprising:
depositing an interlevel dielectric layer over the first dielectric layer and each trench in the first set of a plurality of trenches after the planarizing at least the first conductive layer and the second conductive layer,
forming a set of vias in the interlevel dielectric layer over each of the trenches in the first set of a plurality of trenches.

* * * * *